US008901588B2

(12) United States Patent
Thompson et al.

(10) Patent No.: US 8,901,588 B2
(45) Date of Patent: Dec. 2, 2014

(54) LED DEVICES HAVING LENSES AND METHODS OF MAKING SAME

(71) Applicant: 3M Innovative Properties Company, St. Paul, MN (US)

(72) Inventors: David S. Thompson, West Lakeland, MN (US); Robert S. Davidson, Bloomington, MN (US); Chien-Chih Chiang, Taiwan (TW); Huang Chin Hung, Taiwan (TW)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/671,745

(22) Filed: Nov. 8, 2012

(65) Prior Publication Data

US 2013/0062652 A1 Mar. 14, 2013

Related U.S. Application Data

(62) Division of application No. 12/030,265, filed on Feb. 13, 2008, now Pat. No. 8,330,176.

(60) Provisional application No. 60/889,627, filed on Feb. 13, 2007, provisional application No. 61/013,789, filed on Dec. 14, 2007.

(51) Int. Cl.
| | | |
|---|---|---|
| *H01L 33/00* | (2010.01) | |
| *G02B 19/00* | (2006.01) | |
| *H01L 23/00* | (2006.01) | |
| *B29C 45/14* | (2006.01) | |
| *B29C 33/00* | (2006.01) | |
| *H01L 33/52* | (2010.01) | |
| *B29C 45/16* | (2006.01) | |
| *H01L 33/48* | (2010.01) | |
| *F21K 99/00* | (2010.01) | |

(52) U.S. Cl.
CPC ...... *B29C 45/14655* (2013.01); *G02B 19/0061* (2013.01); *B29C 33/0044* (2013.01); *B29C 2793/0045* (2013.01); *B29C 33/0038* (2013.01); *H01L 33/52* (2013.01); *H01L 2224/48091* (2013.01); *B29C 45/1671* (2013.01); *G02B 19/0028* (2013.01); *H01L 2924/01087* (2013.01); *B29C 2793/009* (2013.01); *H01L 2224/48247* (2013.01); *B29C 33/0022* (2013.01); *H01L 24/97* (2013.01); *H01L 33/483* (2013.01); *F21K 9/00* (2013.01)
USPC ............................................................ 257/98

(58) Field of Classification Search
USPC ............................................. 257/98, E33.001
See application file for complete search history.

(56) References Cited

U.S. PATENT DOCUMENTS

| | | |
|---|---|---|
| 3,159,662 A | 12/1964 | Ashby |
| 3,220,972 A | 11/1965 | Lamoreaux |

(Continued)

FOREIGN PATENT DOCUMENTS

| | | |
|---|---|---|
| CN | 1074923 A | 8/1993 |
| CN | 1682376 A | 10/2005 |

(Continued)

OTHER PUBLICATIONS

Choi et al., "Flourinated Organic—Inorganic Hybrid Mold as a new Stamp for Nanoimprint and Soft Lithography", Langmuir vol. 21, pp. 9390-9392, 2005.

*Primary Examiner* — Tran Tran

(57) ABSTRACT

Disclosed herein are LED devices having lenses and methods of making the devices. The LED devices are made using an optical layer comprising a plurality of lens features. The optical layer is disposed relative to the LED die such that at least one LED die is optically coupled to at least one lens feature. A lens can then be made from the lens feature and excess optical layer removed to provide the device.

13 Claims, 10 Drawing Sheets

(56) References Cited

U.S. PATENT DOCUMENTS

| | | |
|---|---|---|
| 3,410,886 A | 11/1968 | Joy |
| 4,510,094 A | 4/1985 | Drahnak |
| 4,530,879 A | 7/1985 | Drahnak |
| 4,609,574 A | 9/1986 | Keryk et al. |
| 4,632,899 A | 12/1986 | Takeda |
| 4,670,531 A | 6/1987 | Eckberg |
| 4,822,536 A | 4/1989 | Voinis |
| 4,916,169 A | 4/1990 | Boardman et al. |
| 5,145,886 A | 9/1992 | Oxman et al. |
| 5,169,727 A | 12/1992 | Boardman |
| 5,389,698 A | 2/1995 | Chigrinov et al. |
| 5,435,953 A | 7/1995 | Osada et al. |
| 5,496,961 A | 3/1996 | Dauth et al. |
| 5,507,633 A | 4/1996 | Osada et al. |
| 5,523,436 A | 6/1996 | Dauth et al. |
| 5,603,879 A | 2/1997 | Osada et al. |
| 5,753,538 A | 5/1998 | Kuno et al. |
| 5,834,035 A | 11/1998 | Osada et al. |
| 5,998,096 A | 12/1999 | Umemoto et al. |
| 6,046,250 A | 4/2000 | Boardman et al. |
| 6,066,861 A | 5/2000 | Hohn |
| 6,150,546 A | 11/2000 | Butts |
| 6,204,523 B1 | 3/2001 | Carey et al. |
| 6,274,890 B1 | 8/2001 | Oshio et al. |
| 6,367,949 B1 | 4/2002 | Pederson |
| 6,376,569 B1 | 4/2002 | Oxman et al. |
| 6,399,734 B1 | 6/2002 | Hodd et al. |
| 6,432,137 B1 | 8/2002 | Nanushyan et al. |
| 6,473,554 B1 | 10/2002 | Pelka et al. |
| 6,598,998 B2 | 7/2003 | West et al. |
| 6,617,401 B2 | 9/2003 | Rubinsztajn |
| 6,623,667 B2 | 9/2003 | Lundin |
| 6,650,044 B1 | 11/2003 | Lowery |
| 6,679,621 B2 | 1/2004 | West et al. |
| 6,682,331 B1 | 1/2004 | Peh et al. |
| 6,770,685 B1 | 8/2004 | Chang et al. |
| 6,804,062 B2 | 10/2004 | Atwater et al. |
| 6,806,509 B2 | 10/2004 | Yoshino et al. |
| 6,815,520 B2 | 11/2004 | Yoneda et al. |
| 6,908,682 B2 | 6/2005 | Mustele |
| 6,921,929 B2 | 7/2005 | LeBoeuf et al. |
| 7,144,528 B2 | 12/2006 | Altmann |
| 7,192,795 B2 | 3/2007 | Boardman et al. |
| 7,202,320 B2 | 4/2007 | George et al. |
| 7,245,435 B2 | 7/2007 | Morishita et al. |
| 7,255,920 B2 | 8/2007 | Everaerts et al. |
| 7,256,428 B2 | 8/2007 | Braune et al. |
| 7,482,633 B2 * | 1/2009 | Chiaretti .................. 257/89 |
| 7,932,970 B2 | 4/2011 | Kim |
| 2001/0042865 A1 | 11/2001 | Oshio |
| 2002/0028527 A1 | 3/2002 | Maeda et al. |
| 2002/0105266 A1 | 8/2002 | Juestel |
| 2003/0107316 A1 | 6/2003 | Murakami et al. |
| 2003/0115907 A1 | 6/2003 | Patton et al. |
| 2003/0199603 A1 | 10/2003 | Walker et al. |
| 2004/0084681 A1 | 5/2004 | Roberts |
| 2004/0116640 A1 | 6/2004 | Miyoshi |
| 2004/0173808 A1 | 9/2004 | Wu |
| 2004/0202879 A1 | 10/2004 | Xia et al. |
| 2005/0076376 A1 | 4/2005 | Lind |
| 2005/0162733 A1 | 7/2005 | Cho et al. |
| 2005/0218421 A1 | 10/2005 | Andrews et al. |
| 2005/0244649 A1 | 11/2005 | Kashiwagi et al. |
| 2006/0027828 A1 | 2/2006 | Kikuchi |
| 2006/0091798 A1 | 5/2006 | Ouderkirk et al. |
| 2006/0100299 A1 | 5/2006 | Malik et al. |
| 2006/0105480 A1 | 5/2006 | Boardman |
| 2006/0138437 A1 | 6/2006 | Huang et al. |
| 2006/0138443 A1 | 6/2006 | Fan et al. |
| 2006/0142722 A1 | 6/2006 | Koenig et al. |
| 2006/0262817 A1 | 11/2006 | Yu et al. |
| 2007/0029569 A1 | 2/2007 | Andrews |
| 2007/0092636 A1 | 4/2007 | Thompson et al. |
| 2007/0092736 A1 | 4/2007 | Boardman et al. |
| 2007/0112147 A1 | 5/2007 | Morita et al. |
| 2007/0134425 A1 | 6/2007 | Morita et al. |
| 2007/0244214 A1 | 10/2007 | Yoshitake et al. |
| 2008/0044934 A1 | 2/2008 | Loh et al. |
| 2009/0190211 A1 | 7/2009 | Kodama et al. |

FOREIGN PATENT DOCUMENTS

| | | |
|---|---|---|
| EP | 1198016 A2 | 4/2002 |
| JP | 10-158349 | 6/1998 |
| JP | 2000-19356 | 1/2000 |
| JP | 2000-296555 | 9/2000 |
| JP | 2002-319709 | 10/2002 |
| JP | 2005-248122 | 9/2005 |
| JP | 2006-49524 | 2/2006 |
| JP | 2006-137895 | 6/2006 |
| JP | 2008-521252 | 6/2008 |
| KR | 10-2006-0104432 | 10/2006 |
| WO | WO 95/25735 | 9/1995 |
| WO | WO 03/069015 | 8/2003 |
| WO | WO 2006/013066 | 2/2006 |
| WO | WO 2006/055456 | 5/2006 |
| WO | WO 2007/024069 | 3/2007 |

* cited by examiner

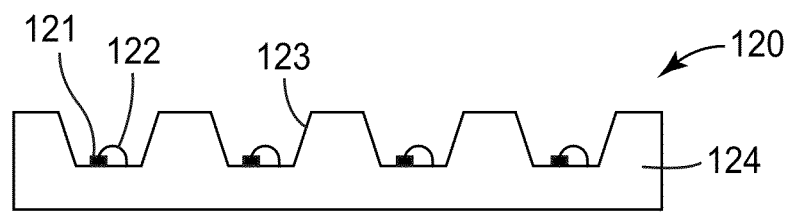
FIG. 12
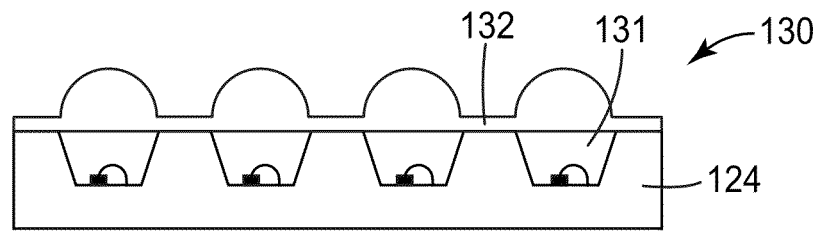
FIG. 13
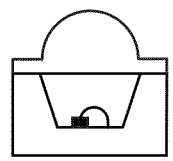 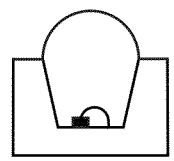
FIG. 14a    FIG. 14b

LED DEVICES HAVING LENSES AND METHODS OF MAKING SAME

CROSS REFERENCE TO RELATED APPLICATIONS

This application is a divisional application of U.S. application Ser. No. 12/030,265, filed Feb. 13, 2008, now allowed, which claims the benefit of U.S. Provisional Patent Application Nos. 60/889,627, filed Feb. 13, 2007, and 61/013,789, filed Dec. 14, 2007, the disclosure of which is incorporated by reference in their entirety herein.

FIELD OF THE INVENTION

This disclosure is related to light emitting diode (LED) devices in which LED die are optically coupled to lenses.

BACKGROUND

LED devices can be manufactured in a variety of configurations, many of which incorporate one or two conductive metal wires connecting a semiconductor or LED die to electrodes at the base of a substrate. Care must be exercised when handling the devices because bonding points of the wires to the electrodes and/or the LED die can easily be damaged. LED die are typically encapsulated with a transparent material or encapsulant which serves to protect the die and wire bonds from physical damage.

LED devices are typically characterized by performance characteristics such as brightness and emission distribution. With the proper selection of transparent material, an encapsulant can be used to increase brightness of an LED device by increasing the amount of light extracted from the LED die. Another way to increase brightness is to attach a lens having a curved outer surface to the LED die such that the two are optically coupled. Modification of the shape of outer surface of the lens is useful for making LED devices having modified emission distributions, for example LED devices having collimated emission distributions or side emitting distributions.

There is a need for new fast, efficient, and low cost methods for manufacturing LED devices having lenses designed to improve efficiency and/or having designed emission distributions.

SUMMARY

Disclosed herein are LED devices and methods of making the devices. In one aspect, disclosed herein is an LED assembly comprising: a plurality of LED die disposed on a substrate, and a removable protective layer having a plurality of perforations, the removable protective layer disposed on the substrate on the same side as the plurality of LED die such that at least one perforation is registered with at least one LED die. The LED assembly may further comprise an optical bonding composition disposed over the LED die. The LED assembly may further comprise an optical layer comprising a plurality of lens features, the optical layer contacting the optical bonding composition such that at least one LED die is optically coupled to at least one lens feature.

In another aspect, disclosed herein is an LED assembly comprising: a substrate comprising a plurality of reflecting cups, at least one LED die disposed in at least one reflecting cup, an optical bonding composition disposed over the at least one LED die, and an optical layer comprising a plurality of lens features, the optical layer contacting the optical bonding composition such that the at least one LED die is optically coupled to at least one lens feature.

In another aspect, disclosed herein is a method of making an LED assembly, the method comprising: providing a plurality of LED die disposed on a substrate, providing a removable protective layer having a plurality of perforations, disposing the removable protective layer on the substrate on the same side as the plurality of LED die such that at least one perforation is registered with at least one LED die, disposing a polymerizable composition over the at least one LED die, and applying actinic radiation and/or heat to polymerize the polymerizable composition. The method may further comprise: providing an optical layer comprising a plurality of lens features, and contacting the polymerizable composition with the optical layer such that the at least one LED die is optically coupled to at least one lens feature.

In another aspect, disclosed herein is a method of making an LED assembly, the method comprising: providing a plurality of LED die disposed on a substrate, providing a removable protective layer having a plurality of perforations, disposing the removable protective layer on the substrate on the same side as the LED die such that at least one perforation is registered with at least one LED die, and disposing an optical bonding composition over the at least one LED die. The method may further comprise: providing an optical layer comprising a plurality of lens features, and contacting the optical bonding composition with the optical layer such that at least one LED die is optically coupled to at least one lens feature.

In another aspect, disclosed herein is a method of making an LED assembly, the method comprising: providing a substrate comprising a plurality of reflecting cups, at least one reflecting cup comprising at least one LED die, disposing a polymerizable composition over the at least one LED die, providing an optical layer comprising a plurality of lens features, contacting the polymerizable composition with the optical layer such that the at least one LED die is optically coupled to at least one lens feature, and applying actinic radiation and/or heat to polymerize the polymerizable composition.

In another aspect, disclosed herein is a method of making an LED assembly, the method comprising: providing a substrate comprising a plurality of reflecting cups, at least one reflecting cup comprising at least one LED die, disposing an optical bonding composition over the at least one LED die, providing an optical layer comprising a plurality of lens features, contacting the optical bonding composition with the optical layer such that the at least one LED die is optically coupled to at least one lens feature.

These and other aspects of the invention are described in the detailed description below. In no event should the above summary be construed as a limitation on the claimed subject matter which is defined solely by the claims as set forth herein.

BRIEF DESCRIPTION OF THE DRAWINGS

The invention may be more completely understood in consideration of the following detailed description in connection with the following figures:

FIG. 12 is a schematic diagram in cross-sectional perspective of an exemplary LED array.

FIG. 13 is a schematic diagram in cross-sectional perspective of an exemplary LED assembly comprising an LED array and an optical layer comprising lens features.

FIGS. 14a and 14b are schematic diagrams in cross-sectional perspective of two exemplary LED devices having lenses.

DETAILED DESCRIPTION

This application claims the benefit of U.S. Provisional Patent Application Nos. 60/889,627, filed Feb. 13, 2007, and 61/013,789, filed Dec. 14, 2007, the disclosures of which are incorporated herein by reference in their entirety.

LED devices can be manufactured in a variety of configurations, many of which incorporate one or two conductive metal wires connecting a semiconductor die to electrodes in the base of an LED package. An LED package is a subassembly comprising a surface upon which an LED die can be mounted, an electrical lead having an electrode at one end that can be connected to the LED die and a connection point at the other end for an external power source, and a complementary electrical lead having an electrode at one end that can be connected to the LED die and a connection point at the other end for an external power sink. A package may optionally include a reflecting cup that is a surface for directing light from the LED away from the subassembly.

Figure 1:
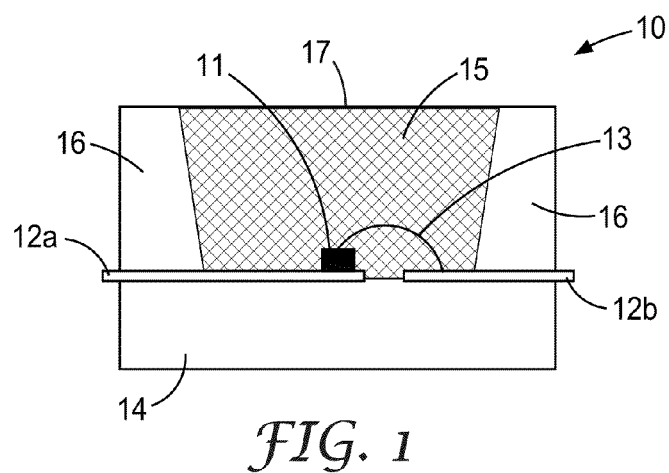
FIGS. 1-3 are schematic diagrams in cross-sectional perspective of known LED devices.

FIG. 1 is a schematic diagram of typical surface mount LED device 10 with one wire bond 13 bonded to LED die 11. The LED die is connected to electrodes 12a and 12b, which are disposed on support 14 inside reflecting cup 16. The LED die is encapsulated with encapsulant 15. While the surface of the encapsulant 17 is flat, in practice real LED devices often have a slight negative meniscus or curvature, meaning the surface of the encapsulant is concave. This negative meniscus, commonly seen in commercially available surface mount LED devices, can result from the use of a thermally cured encapsulant composition, for example, a thermally curable epoxy or silicone resin. The negative meniscus typically forms as a result of shrinkage as the encapsulant composition cools to room temperature from an elevated temperature used for curing. Temperatures used to cure thermally curable resins are often significantly higher than the temperatures that the encapsulant will experience when the LED device is in use. The negative meniscus is undesirable because it can lead to increased recycling of light emitted by the LED die which can decrease efficiency and light output. For example, the support, electrodes, LED die, and encapsulant often contain materials that can absorb some small fraction of the light generated by the LED die, especially blue and UV light.

Figure 2:
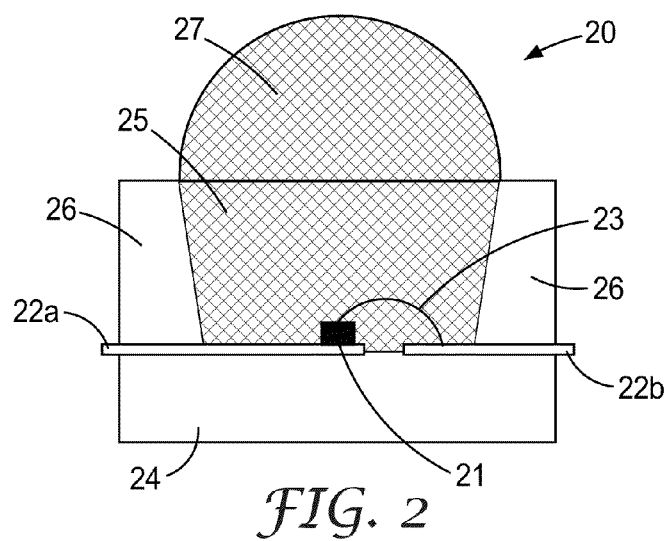

In order to improve LED performance with respect to brightness and control of the spatial radiation pattern of the light emitted from the LED die, LED devices are often made with an optical element such as a lens as shown in FIG. 2. FIG. 2 is a schematic diagram of surface mount LED device 20 with one wire bond 23 bonded to LED die 21. The LED die is connected to electrodes 22a and 22b which are disposed on support 24 inside reflecting cup 26. To the surface of encapsulant 25 is bonded a lens 27. LED devices such as 20 are commonly manufactured by placing the lens onto the surface of the encapsulant using a pick and place operation, one at a time.

Figure 3:
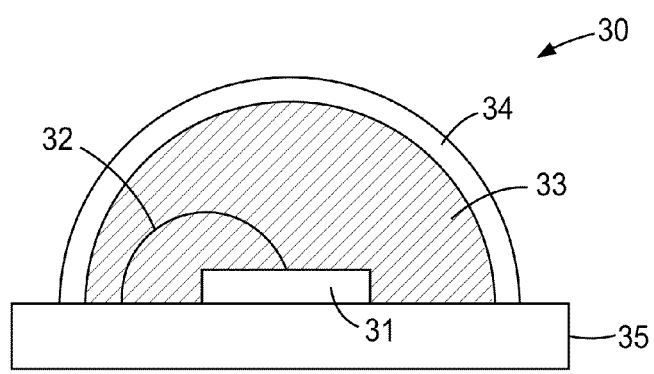

FIG. 3 shows another example of an LED device having a lens. FIG. 3 is a schematic diagram of surface mount LED device 30 with one wire bond 32 bonded to LED die 31. The LED die is connected to electrodes (not shown) disposed on substantially planar support 35. LED device 30 is typically constructed by providing a soft silicone gel 33 around the LED die and wire bond and covering it with a suitably shaped hard outer shell or lens 34 that is formed in a separate process such as injection molding. The external shell can be shaped to produce desired light emission distributions from the LED device. LED devices such as 30 are commonly manufactured by placing the lens using a pick and place operation as described above.

Efficient and low cost methods for manufacturing LED devices having lenses are disclosed herein. As used herein, LED device refers to an LED die with optional wire bonds disposed on a substrate or in reflecting cups, the LED die optically coupled to a lens with an optical bonding composition (described below) disposed between the LED die and the lens. The LED devices are prepared using LED assemblies that comprise a plurality of LED die disposed on a substrate or in reflecting cups. The lenses are provided in the form of an optical layer having a plurality of lens features. The optical layer is disposed on the substrate such that at least one lens feature is optically coupled to at least one LED die. An optical bonding composition is disposed between the LED die and the optical layer. The optical layer may then be perforated such that at least one lens is formed from a lens feature. Excess optical layer may then be removed through the use of an underlying removable protective layer having perforations that are generally registered with the LED die. The method may be carried out as a large-scale parallel process that can eliminate the need to pick and place premolded lenses during the manufacturing process, thus reducing manufacturing cycle times and reducing overall LED cost.

For the embodiments described herein, the term plurality is used to refer to the number of LED die, the number of perforations in the removable protective layer, the number of lens features in the optical layer, etc. In general, plurality means at least two. LED assemblies can comprise anywhere from 2 to millions of LED die mounted on a substrate, e.g., 2 to 10 million, 2 to 5000, or 2 to 500 LED die mounted on a substrate. The protective layer may have the same number of perforations as LED die, or it may have more or less. Likewise, the optical layer may have the same number of lens features as LED die and/or perforations, or it may have more or less. For illustration only, the embodiments described below have 4×7 arrays of LED die on a substrate, with the same layout of perforations in the protective layer and lens features in the optical layer. The LED die, perforations, and lens features may be arranged in a pattern or array, or they may be randomly arranged. Further, the embodiments described below have lens features having hemispherical shapes, but any type of lens shape, such as those described below, can be used.

Figure 4:
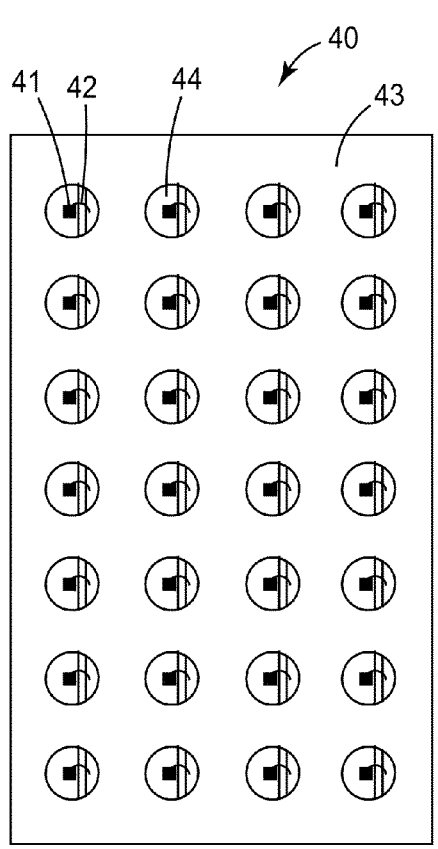
FIG. 4 is a schematic diagram in top down perspective of an exemplary LED array.

An embodiment of the present disclosure may be described for the LED assembly shown in FIG. 4. LED assembly 40 comprises plurality of LED die 41 disposed on substrate 43. The LED die may be mounted on the substrate via electrodes 44 and wire bonds 42. This type of assembly is sometimes referred to as a chip-on-board array.

An LED die disposed on a substrate refers to an LED die, substrate, and any electrical contacts such as wire bonds and electrodes. An LED die is an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on a wafer scale, the finished wafer finally being diced into individual piece parts to yield a multiplicity of LED die. Useful LED die can emit visible, ultraviolet, or infrared light depending on the composition and structure of the semiconductor layers. Monochrome and phosphor-LEDs (in which blue or UV light is converted to another color via a fluorescent phosphor) can also be used. The LED die can be arranged in any configuration on the substrate. They may be arranged in an array form, such as the array shown in FIG. 4, or they can be randomly arranged. The LED die can be arranged in groups on the substrate, and each LED die in a group can emit the same or different colored light. For example, the LED die can be arranged to emit white light, for example, by combining red, green, and blue LED die in a group, or blue and yellow LED dies in a group. Groups having as many as thousands of LED die are also possible. An LED die can have optical elements attached to it, e.g., an extractor capable of extracting light from the die.

As used herein, substrate refers to one or more surfaces of the LED assembly that are generally coplanar and in between the LED die and are placed in contact with the removable protective layer described below. The substrate may comprise a circuit board, for example, an FR-4 type printed circuit board, a metal core printed circuit board, a flexible circuit made on a film based material such as polyimide and liquid crystal polyester, or a circuit board made of a ceramic material such as alumina and aluminum nitride. The substrate may comprise a circuit board on silicon. The substrate may also comprise a plurality of reflecting cups, wherein at least one reflecting cup comprises at least one LED die. This embodiment is described below.

Figure 5:
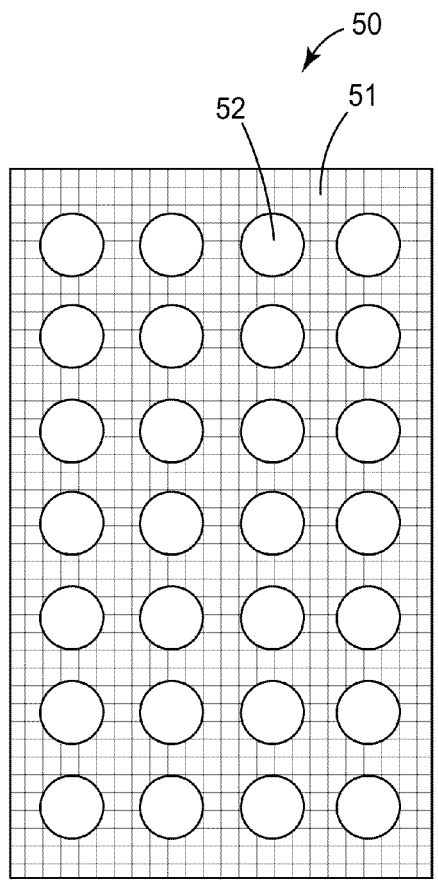
FIG. 5 is a schematic diagram in top down perspective of an exemplary removable protective layer.
Figure 6:
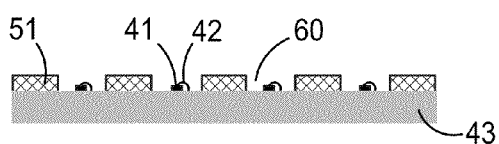
FIG. 6 is a schematic diagram in cross-sectional perspective of an exemplary LED assembly comprising an LED array and a removable protective layer.

FIG. 5 shows a schematic diagram in top down perspective of exemplary removable protective layer 50 comprising thin layer of material 51 having plurality of perforations 52. The removable protective layer is disposed on the substrate such that the perforations are generally registered with the LED die. The LED die do not have to be centered inside the perforations as viewed from above, and the placement of the LED die inside the perforations can differ. In some embodiments, the removable protective layer does not contact the LED die. In some embodiments, the removable protective layer and the LED die are registered such that the LED die are not covered when the assembly is viewed from above. FIG. 6 shows a schematic diagram in cross-sectional perspective of the removable protective layer shown in FIG. 5 disposed on the substrate of the LED array shown in FIG. 4. The perforations and substrate create wells 60 in which the LED die, wire bonds, and electrodes reside.

The removable protective layer can have any useful thickness, e.g., from about 10 um to about 5 mm. For a chip on board configuration as shown in FIG. 6, the removable protective layer may be at least as thick as the cumulative height of the LED die, wire bonds, and electrodes, e.g., from about 100 um to about 5 mm. For the embodiments shown in FIGS. 12 and 16, the thickness of the removable protective layer may be from about 10 um to about 5 mm.

The removable protective layer can comprise a variety of materials. Preferred materials are those that can create a seal with the substrate when desired. The seal helps to prevent optical bonding composition from leaking out of the wells. Preferred materials are also those that can be removed from the substrate when desired; this may be after seconds or after months of contact of the removable protective layer and the substrate. Preferred materials used for the removable protective layer may also need to withstand temperatures up to approximately 120° C. for extended periods of time. This thermal stability may be needed in cases where the optical bonding composition described below is a polymerizable composition that requires heat for curing. Examples of materials suitable for use as removable protective layers include metals such as aluminum, ceramics, and polymers.

The removable protective layer may also comprise a pressure sensitive adhesive (PSA). The PSA may be repositionable on the substrate after some desired length of time. The particular PSA used must not build adhesion to the point where it cannot be removed from the substrate without damaging the substrate. Suitable PSAs include (meth)acrylate-based PSAs formed from free-radically polymerizable monomers selected from the group of (meth)acrylates, vinyl monomers, and mixtures thereof. As used herein, (meth)acrylate refers to both acrylates and methacrylates. Examples of (meth)acrylates include alkyl esters of (meth)acrylic acid wherein the alkyl group has from 1 to 20 carbon atoms, for example, ethyl acrylate, isobornyl methacrylate, and lauryl methacrylate; aromatic esters of (meth)acrylic acid such as benzyl methacrylate; and hydroxyalkyl esters of (meth)acrylic acid such as hydroxy ethyl acrylate. Examples of vinyl monomers include vinyl esters such as vinyl acetate, styrene and derivatives thereof, vinyl halides, vinyl propionates, and mixtures thereof. Further examples of monomers suitable for making the (meth)acrylate based PSAs are described in US 2004/202879 A1 (Xia et al.) which also describes methods for polymerizing the monomers. If desired, the PSA may be crosslinked as described in Xia et al.

In some embodiments, the PSA is formed from a (meth) acrylate block copolymer as described in U.S. Pat. No. 7,255,920 B2 (Everaerts et al.). In general, these (meth)acrylate block copolymers comprise: at least two A block polymeric units that are the reaction product of a first monomer composition comprising an alkyl methacrylate, an aralkyl methacrylate, an aryl methacrylate, or a combination thereof, each A block having a Tg of at least 50° C., the methacrylate block copolymer comprising from 20 to 50 weight percent A block; and at least one B block polymeric unit that is the reaction product of a second monomer composition comprising an alkyl(meth)acrylate, a heteroalkyl(meth)acrylate, a vinyl ester, or a combination thereof, the B block having a Tg no greater than 20° C., the (meth)acrylate block copolymer comprising from 50 to 80 weight percent B block; wherein the A block polymeric units are present as nanodomains having an average size less than about 150 nm in a matrix of the B block polymeric units.

In some embodiments, the PSA is a silicone-based PSA. Examples of silicone-based PSAs are those that comprise a high molecular weight silicone gum and a silicate MQ resin, the MQ resin usually present at a level of 50-60% by weight with respect to solids. Other examples of silicone-based PSAs are described in U.S. Pat. No. 5,169,727 (Boardman). In general, these PSAs are photocurable and are formed from a composition comprising a flowable mixture of (a) a benzene soluble, resinous copolymer having triorganosiloxy and $SiO_{4/2}$ units, (b) a diorganoalkenylsiloxy endblocked polydiorganosiloxane, (c) a diorganohydrogensiloxy endblocked polydiorganosiloxane, (d) an organosilicon crosslinking agent being selected from organosilicon compounds having from 1 to 15 silicon atoms, and (e) a hydrosilation catalyst in an amount sufficient to effect curing of the composition. The silicone-based PSA may also comprise hydrosilylation inhibitors, photosensitizers, fillers, etc.

Useful PSAs may be provided as a layer coated on a backing to form a tape. The tape may be contacted with the substrate such that the PSA layer is between the substrate and the backing. If a backing is used, it may comprise a nonporous material. Examples of thermally stable tapes include those with fluoropolymer backings, certain polyolefin backings, as well as backings comprising polyesters, aramids, polyimides, high temperature vinyls, and nylons. One exemplary tape having the preferred thermal stability is polyolefin tape 2850L 600MMX100M available from 3M Company.

In some embodiments, the removable protective layer further comprises a reflective or absorptive layer. When disposed on the substrate, the reflective or absorptive layer is disposed between the removable protective layer and the substrate. Reflective layers may be used when an array of LED devices will be used as a lighting unit as in a backlight or luminaire. Examples of reflective layers include metallic reflectors such as silver and aluminum, and polymeric reflectors such as Vikuiti™ ESR film available from 3M Company. Absorptive layers may be used in LED devices used for decorative applications or when sharp contrast is needed. Examples of absorptive layers include black or colored paints, films, or coatings. In some embodiments, it may be desirable to include an adhesive layer disposed on the reflective or absorptive layer opposite the removable protective layer. The adhesive layer contacts the substrate when the removable protective layer is disposed thereon. Suitable adhesives that may be used include any of the PSAs described above.

The perforations of the removable protective layer can be of any shape and size needed. In FIG. 5, the perforations are shown as circles in two dimensions, and they all have the same diameter which is slightly larger than the diameter of the electrodes shown in FIG. 4. If desired, however, the perforations can have shapes that differ from those of the electrodes. It is also optional as to whether the number and positioning of the perforations matches those of the LED die. For example, a removable protective layer with more perforations than LED die may be used. The shapes of the perforations may also depend on the shapes of the perforations made in the optical layer as described below. In general, as described below, the shape and size of each perforation in the removable protective layer are designed so that when it is removed, the corresponding lens that is formed imparts suitable optical properties to the LED device. Other examples of shapes and sizes are described below for additional embodiments.

The removable protective layer may be applied to the substrate at any time prior to applying the optical bonding composition. The removable protective layer may be applied to the substrate prior to mounting the LED die and wire bonds. The perforations in the removable protective layer may be precut into the layer prior to application to the substrate. When the perforations are precut, a mechanism for registering the perforations with the positions of the LED die on the substrate is required. This can be accomplished using an alignment jig and precutting the removable protective layer to the shape of the perimeter of the LED assembly to provide for physical registration. For high volume applications, the removable protective layer can be precut and be provided as a continuous roll of tape that can be applied from the roll in manufacturing. The placement of the removable protective layer on the substrate can also be assisted by using machine vision. Another option for applying the removable protective layer to the substrate such that the perforations in the tape are registered with the LED die and electrode positions is to apply the removable protective layer prior to mounting the die and wire bonds and cutting the perforations in the layer. Cutting can be carried out by kiss-cutting, rotary cutting, or laser cutting techniques. It is also anticipated that the removable protective layer can be applied in a controlled dispensing or coating operation as a curable liquid or solvent cast film which when cured or dried becomes the removable protective layer.

Figure 7:
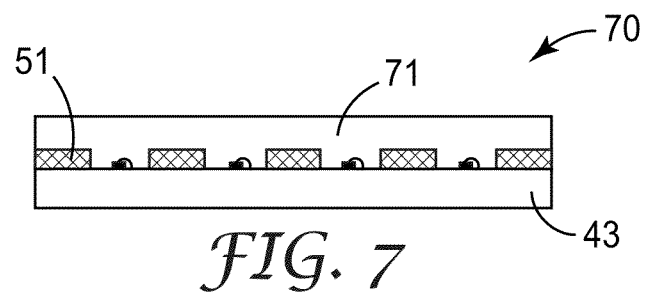
FIG. 7 is a schematic diagram in cross-sectional perspective of an exemplary LED assembly comprising an LED array, a removable protective layer, and an optical bonding composition.

The wells 60 as shown in FIG. 6 may be filled with an optical bonding composition such that it occupies some volume of the wells and is able to contact the optical layer when applied. If desired, the wells may be slightly overfilled so that a thin layer of the optical bonding composition 71 may be formed over the removable protective layer to give LED assembly 70 shown in FIG. 7. In this example, the optical bonding composition is also an encapsulant in the sense that it directly contacts the LED die. In some embodiments, the wells may be slightly overfilled but a layer is not completely formed. The optical bonding composition can be applied by syringe dispensing, jetting, or other coating techniques.

The optical bonding composition is suitable for optical bonding in the sense that it does not detract from the optical function of the LED device. Thus, the choice of the particular optical bonding composition may depend on the application and/or type of the LED device. In general, the optical bonding composition bonds to the optical layer. Ideally, bonding does not decrease over time due to factors such as a lack of photo and/or thermal stability of the optical bonding composition.

The optical bonding composition may comprise epoxy resins, acrylate resins, and other materials typically used as encapsulants. In some embodiments, a polymerizable composition may be used as the optical bonding composition. In these cases, the optical layer may be contacted with the polymerizable composition before the polymerizable composition is polymerized, however, the optical layer may also be applied after the polymerizable composition is polymerized or at least partially polymerized. The optical bonding composition may have photo and thermal stability. In some embodiments, the optical bonding composition comprises a silicon-containing resin which can be the product of either traditional heat-cured silicone materials or UV-cured organosiloxanes described in U.S. Pat. No. 7,192,795 B2 (Boardman et al.). In some embodiments, the optical bonding composition comprises a polyorganosiloxane. The optical bonding composition may comprise scattering particles, high refractive index nanoparticles, and/or phosphors.

In some embodiments, the optical bonding composition comprises a PSA, such as any of the PSAs described above. The proper choice of PSA may be determined by the application in which the LED device is to be used. The PSA should be chosen such that it adheres to the optical layer. Ideally, the PSA does not lose adhesion over time and is stable under the conditions of use. Ideal PSAs do not detract from the optical function of the optical article due to degradation of adhesion or degradation of the PSA material itself due to a lack of photo- and/or thermal stability.

Figure 8A:
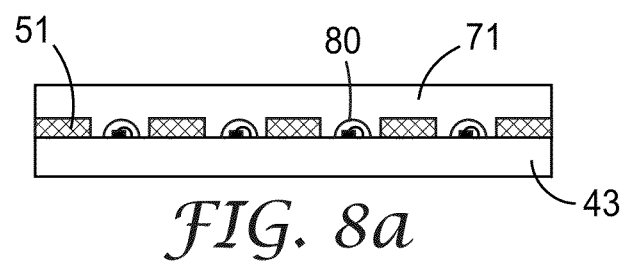
FIGS. 8a and 8b are schematic diagrams in cross-sectional perspectives of exemplary LED arrays in which the LED die with wire bonds are encapsulated with materials separate from the optical bonding composition.
Figure 8B:
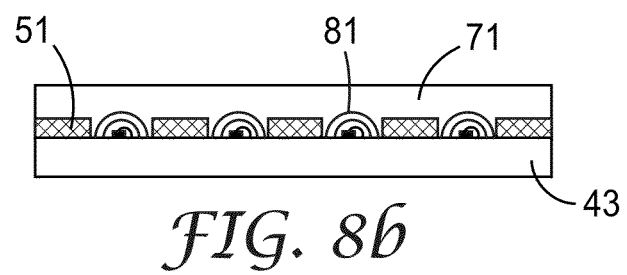

As described above, the optical bonding composition is disposed over the LED die and wire bonds as viewed from a top down perspective. The optical bonding composition may or may not directly contact the die and wire bonds. The optical bonding composition may be referred to as an encapsulant when in direct contact with the LED die and wire bonds. In some embodiments, as shown in FIG. 8a, the LED die and wire bonds may be encapsulated with encapsulant 80 that is disposed between the LED die and optical bonding composition 71. The encapsulant and the optical bonding composition may be different from each other or they may be the same. Examples of useful encapsulants include epoxy, acrylate, and silicon-containing resins such as silicones. In some embodiments, the encapsulant may be an object covering or partially covering the LED die and wire bonds. FIG. 8b shows lens 81 covering the LED die and wire bonds.

Figure 9A:
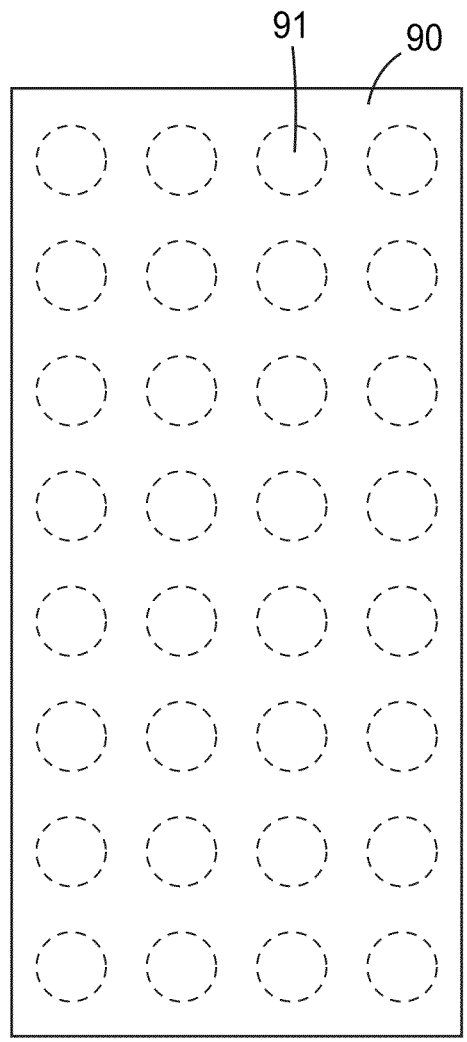
FIGS. 9a and 9b are schematic diagrams in top down and cross-sectional perspectives, respectively, of an exemplary optical layer comprising lens features.
Figure 9B:
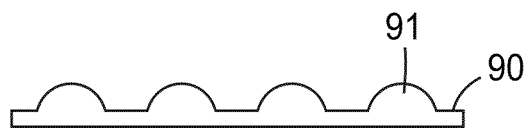

An optical layer comprising a plurality of lens features is used to provide individual lenses that can be optically coupled to the LED die. FIGS. 9a and 9b show schematic diagrams in top down and cross-sectional perspectives, respectively, of exemplary optical layer 90 comprising plurality of lens features 91. The optical layer is contacted with the optical bonding composition such that at least one LED die is optically coupled to at least one lens feature. In the example shown in FIGS. 9a and 9b, the optical layer is designed so that each lens feature can be registered with an LED die. Other configurations may be used, for example, there may be more lens features compared to LED die. In some embodiments, it may be desirable to provide the optical layer in a format that provides alignment of the optical layer with the LED die, so that the optical layer can be attached in an efficient manner with adequate registration.

Figure 10A:
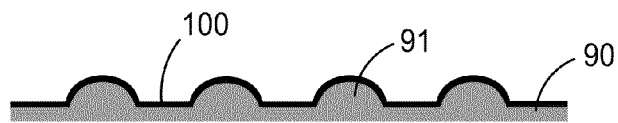
FIGS. 10a-10e are schematic diagrams in cross-sectional perspective of an exemplary optical layer with different molds.
Figure 10B:
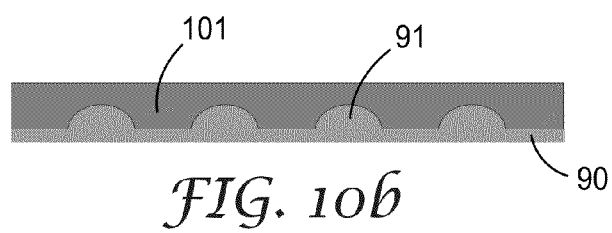
Figure 10C:
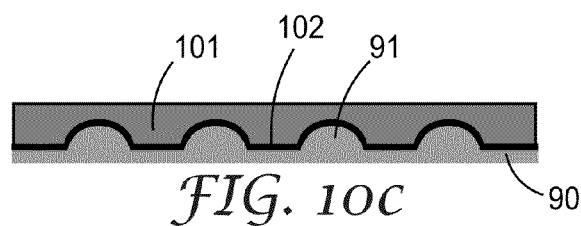
Figure 10D:
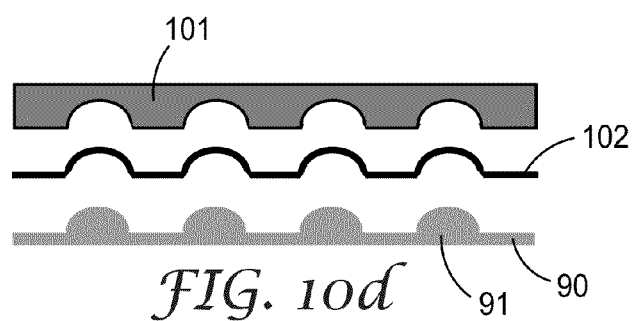
Figure 10E:
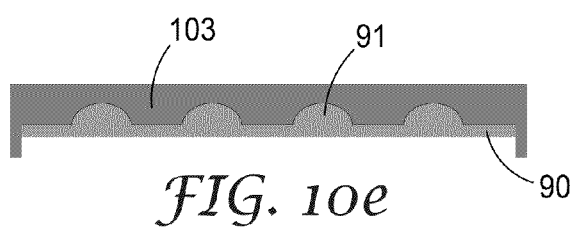

The optical layer comprising a plurality of lens features can be provided in a variety of formats. In FIGS. 9a and 9b, the optical layer comprising a plurality of lens features is provided as a continuous stand alone layer with relatively flat sections between the features. In this case the outer perimeter of the optical layer can be precision cut so that the edges coincide with the outer edges of the LED package array to provide for physical alignment of the lens features and LED die. An alignment jig may also be used to register the edges of the optical layer and the LED package array to provide alignment. Another format is shown in FIG. 10a wherein the optical layer comprising a plurality of lens features is provided with cover film 100 over the lens features. The cover film can be a protective release liner or may be a stiff thermoformed or molded film used to mold the optical layer. As described above, the cover film can be precision cut to provide an outer edge that can be used for physical registration with the LED package array. Another format is shown in FIG. 10b wherein the optical layer comprising a plurality of lens features is provided with mold 101 used to make the optical layer. Another format is shown in FIG. 10c which comprises release film or mold insert 102 disposed between the optical layer and mold of FIG. 10b. FIG. 10d shows the three elements of this construction in an exploded view for clarity. Another format is shown in FIG. 10e in which mold 103 is designed to act as an alignment jig such that the LED die can be aligned with the lens features. The lens features may also be aligned with the LED die using machine vision using optical fiducials or by using mechanical fiducials or guides designed into the optical layer and/or into the LED package substrate.

The optical layer can be comprised of any optically transparent material. The optically transparent material may be colorless. Examples of such materials include acrylic, polycarbonate, and cycloolefin polymers (such as Zeonex available from Zeon Corporation), and silicones. The optical layer can be made using injection molding of thermoplastics or by injection or compression molding of thermoset or photoset materials. Optical layers made from thermoset and photoset materials may also be produced using cast and cure molding and replication. Preferred materials are silicon-containing resins. Examples of silicon-containing resins include polyorganosiloxanes such as those described in U.S. Pat. No. 7,192,795 B2 (Boardman et al.) that can be UV or thermally cured. Low refractive index silicone resins, such as methyl-silicones (refractive index ~1.41), are most preferred because of their excellent photo and thermal stability. The optical layer may also comprise multiple layers of different materials with varying properties such as refractive index, hardness, modulus, etc. The lens features (and lenses derived therefrom) constitute an outer portion of the final LED devices. As such, it may be desirable for the optical layer to be made from a hard, tough, and/or mechanically robust material that may provide surface protection and/or alleviate dust pick up issues common to many current commercial materials.

In some embodiments, the optical bonding composition and the optical layer may have different properties. For example, in cases where a hard, tough material is used for the optical layer, and if the optical bonding composition is an encapsulant, it may be desirable to use an organosiloxane-containing gel or soft elastomer as the optical bonding composition so that little stress is exerted on the die and wire bonds. For another example, the refractive index of the optical bonding composition may be the same or higher than the refractive index of the optical layer. The optical bonding composition may be composed of multiple layers with differing refractive indices, where the refractive index of the layer of optical bonding composition in contact with the LED die being higher than the subsequent layers of optical bonding composition, the refractive index decreasing as the distance from the LED die increases. The optical layer in this case has a refractive index lower than the layers of optical bonding composition, thus creating a gradiant of refractive index in the materials.

In general, the optical layer comprises two major surfaces, one which is generally flat, and one that comprises the lens features. The lens features (and lenses derived therefrom) can have any shape useful for refracting light and which can produce a useful emission distribution when optically coupled to the LED die and the die is activated. For example, the lens features may each comprise a positive or negative lens as described in US 2006/0092636 (Thompson et al.) The lens features may provide non-Lambertian light distribution. In some embodiments, the lens features may have a hemispherical shape as shown in the figures. An optical layer can have lens features that differ from one another, for example, some lens features may be hemispherical and some may be shaped with various smaller features.

The lens features may be shaped so that a side-emission pattern is generated upon activation of the LED die. For example, an LED device with a lens may have a central axis such that light entering the device is reflected and refracted and eventually exits in a direction substantially perpendicular to the central axis; examples of these types of side emitting lens shapes and devices are described in U.S. Pat. No. 6,679,621 B2 and U.S. Pat. No. 6,598,998 B2. For another example, an LED device with a lens may have a generally planar surface, with a smoothly curved surface defining a vortex shape that extends into the device and has the shape of an equiangular spiral that forms into a cusp; an example of such a profile is described in U.S. Pat. No. 6,473,554 B1, particularly FIGS. 15, 16 and 16A.

The lens features may comprise macrostructures having a characteristic dimension that is smaller than that of the base of the lens feature but much larger than the wavelength of visible light. That is, each macrostructure may have a dimension of from 10 μm to 1 mm. The spacing or period between each macrostructure may also be from 10 μm to 1 mm. Examples of macrostructures include surfaces that, when viewed in cross-section, appear to be shaped like a sine wave, triangular wave, square wave, rectified sine wave, saw tooth wave, cycloid (more generally curtate cycloid), or rippled. The macrostructures may be randomly arranged or periodic in nature. The periodicity of the macrostructures may be one- or two-dimensional. Surfaces with one-dimensional periodicity have repeat structures along only one major direction of the surface. In one particular example, the surface may comprise structures similar to those of Vikuiti™ Brightness Enhancement Films available from 3M Company.

Surfaces with two-dimensional periodicity have repeat structures along any two orthogonal directions in the plane of the macrostructures. Examples of macrostructures with two-dimensional periodicity include two-dimensional sinusoids, arrays of cones, arrays of prisms such as cube-corners, and lenslet arrays. The lens features may also be shaped as Fresnel lenses, each Fresnel lens having generally circular symmetry designed to replicate the optical properties of any positive or negative lens while occupying much less volume than a solid lens. In general, the macrostructures do not need to be uniform in size across the surface. For example, they may get larger or smaller toward the edges of the lens feature, or they may change shape. The lens features may comprise any combination of shapes described herein.

The lens features may be shaped with microstructures having a characteristic dimension on a scale similar to the wavelengths of visible light. That is, each microstructure may have a dimension of from 100 nm to less than 10 μm. Light tends to diffract when it interacts with microstructured surfaces. Thus, the design of microstructured surfaces requires careful attention to the wave-like nature of light. Examples of microstructures are one- and two-dimensional diffraction gratings; one-, two-, or three-dimensional photonic crystals; binary optical elements; "motheye" anti-reflection coatings; linear prisms having one- or two-dimensional periodicity; and microlenses. The microstructures do not need to be uniform in size across the surface. For example, they may get larger or smaller toward the edges of the lens feature, or they may change shape. The lens features may comprise any combination of shapes described herein.

The lens features may have randomly disposed protrusions and depressions or be shaped with structures from all three size scales. Each lens feature has some radius of curvature, which could be positive, negative, or infinite. A macrostructure or microstructure could be added to a lens feature to further enhance light output or to optimize the angular distribution for a given application. A lens feature could even incorporate a microstructure on a macrostructure.

The shape and size at the base of a lens are part of the design of the LED device, i.e., its desired optical performance, cost, etc. In general, for an individual LED device, the base of the lens must cover all of the LED die that are part of that device. Typically, the base of the lens is at least 10% greater than the size of a single LED die, or the sizes including spacings between die if there are more than one. For an LED device having a single LED die, the base of the lens may be from about 0.5 to about 10 mm, or from about 1 to about 5 mm. For an LED device having three LED die per device, the base of the lens may be from about 1 to about 30 mm. The shape and size at the base of a lens may be the same for all lenses derived from an optical layer, or the shapes and sizes may be different. For example, for the optical layer used in conjunction with a chip-on-board configuration as shown in FIG. 11, the shapes and sizes are the same for all lens features.

The optical bonding composition is contacted with the optical layer such that at least one LED die is optically coupled to at least one lens feature. Generally, this means that the relatively flat side of the optical layer is contacted with the optical bonding composition. FIG. 11 shows a schematic process flow diagram for making LED devices from LED assembly 110 in which the optical layer of FIGS. 9a and 9b is disposed on the LED assembly shown in FIG. 7.

After the optical layer is bonded to the optical bonding composition, at least one lens is formed from a lens feature and the lens is separated from the rest of the optical layer. In some embodiments, the lens is formed by cutting part way through the optical layer to outline the lens so that at some later time, a complete separation can be made. In some embodiments, the lens is formed by completely separating or perforating the optical layer to form the lens. In both embodiments, the lens ultimately ends up being separated from the optical layer which is removed as a perforated optical layer. Cutting can be carried out by die, kiss, laser, or rotary cutting. Perforation in a single step can be carried out by die, laser, or rotary cutting. In some embodiments, the perforation in the optical layer has a size and shape that encompasses the size and shape of the desired lens.

Figure 11:
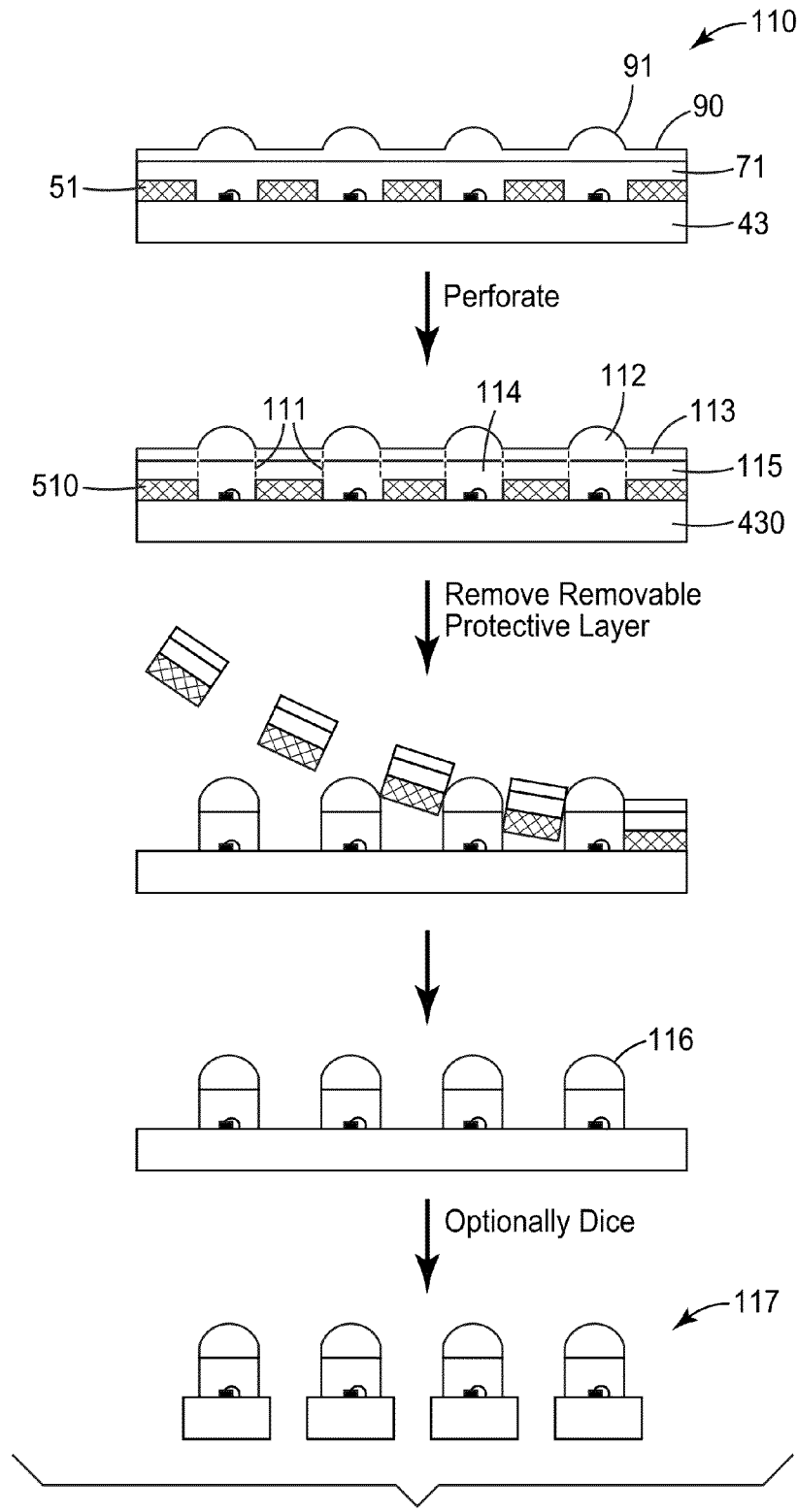
FIG. 11 is a schematic process flow diagram for making LED devices from an LED assembly.

FIG. 11 shows formation of lenses from lens features in cases where the optical bonding composition forms a layer. In this example, perforations 111 are made all the way through the optical layer to form lenses 112 and perforated optical layer 113. Also in this example, the perforations are made all the way through the layer of the optical bonding composition to form optical bonding segments 114 and perforated optical bonding composition layer 115. For embodiments in which a layer of the optical bonding composition is not present, perforating would involve only perforating the optical layer. For embodiments in which some areas on the removable protective layer have optical bonding composition and some do not, perforating would involve perforating the optical bonding composition where needed.

After the perforations are made, the removable protective layer may be removed from the substrate as shown in FIG. 11. Any optical bonding composition and perforated optical layer disposed on the removable protective layer is also removed. In cases where an incomplete layer of optical bonding composition is formed, excess optical bonding composition would be removed wherever it exists on the removable protective layer along with the perforated optical layer. In cases where no optical bonding composition is on the removable protective layer, only the perforated optical layer will be removed.

In some embodiments, the shape of the perforation in the removable protective layer is the same as that of the perforation in the optical layer. In some embodiments, as shown in FIG. 11, the shapes may be the same size and be generally registered with each other. In general, any combination of shapes and sizes can be used for the perforations in the removable protective layer and the optical layer, provided that clean removal of optical bonding composition and perforated optical layer disposed on the removable protective layer can be made without detrimentally affecting the lens that remains with the LED device. In some embodiments, the perforation in the removable protective layer is larger than that of the perforation in the optical layer.

After complete removal of the removable protective layer and the optical bonding composition and perforated optical layer, a plurality of LED devices 116 remain on the substrate. Optionally, the LED devices may be separated from each other to form individual LED devices 117. As used herein, LED device refers to an LED die disposed on a substrate, the LED die optically coupled to a lens with an optical bonding composition disposed between the LED die and the lens. Separation of the individual LED devices can be carried out by saw cutting, laser cutting, or other dicing techniques.

Some LED assemblies comprise a substrate such that a reflecting cup or well is formed around each LED die or group of LED dies. FIG. 12 is a schematic diagram in cross-sectional perspective of exemplary LED array 120 in which LED die 121 with wire bonds 122 are disposed in reflecting cups 123 of substrate 124. For a reflecting cup or well having a single LED die, the diameter of the cup may range from about 0.5 to about 10 mm, or from about 1 to about 5 mm. For a reflecting cup or well having three LED die, the diameter of the cup may range from about 1 to about 30 mm.

For the embodiment shown in FIG. 12, the reflecting cups may be filled or slightly overfilled with the optical bonding composition. The optical layer may then be disposed on the substrate which may or may not have the optical bonding composition on it. FIG. 13 is a schematic diagram in cross-sectional perspective of LED assembly 130 in which the reflecting cups are not overfilled with optical bonding composition 131, and optical layer 132 is disposed on substrate 124. As described above, the optical bonding composition bonds to the optical layer. In some embodiments, if separation of the LED devices is desirable, they can be separated to give individual LED devices as shown in FIG. 14a. In some embodiments, if separation of the LED devices is desirable, the optical layer can be perforated, for example by kiss cutting, around the lens features and excess optical bonding composition and perforated optical layer on the substrate removed. Separation of the LED devices can then be carried out to give individual LED devices as shown in FIG. 14b. In cases where the reflecting cups are overfilled with optical bonding composition, release agents may be employed on the top surface of the substrate in order to facilitate removal of any excess optical bonding composition and perforated optical layer.

Figure 15A:
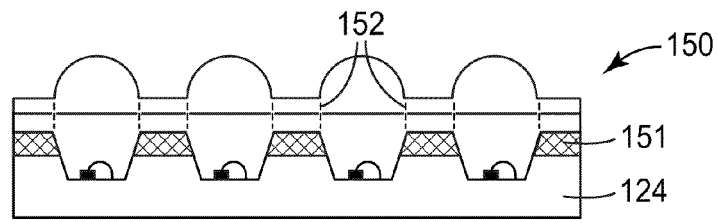
FIG. 15a is a schematic diagram in cross-sectional perspective of an exemplary LED assembly including an optical layer comprising lens features.
Figure 15B:
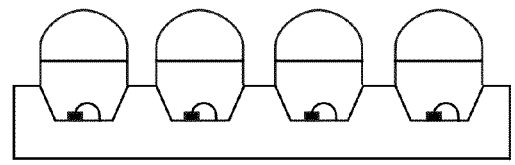
FIG. 15b is a schematic diagram in cross-sectional perspective of an exemplary array of LED devices having lenses.

In some embodiments, the removable protective layer may be used in cases where the reflecting cups are overfilled with optical bonding composition. FIG. 15a is a schematic diagram in cross-sectional perspective of LED assembly 150 in which the reflecting cups are overfilled so that the optical bonding composition forms a layer. An optical layer comprising a plurality of lens features is disposed thereon. Removable protective layer 151 is disposed on substrate 124 before the cups are overfilled. Perforations 152 indicate where the optical layer and optical bonding composition can be perforated to form individual lenses. FIG. 15b is a schematic diagram in cross-sectional perspective of LED devices after perforation and removal of the removable protective layer, excess optical bonding composition, and perforated optical layer. In some embodiments, the removable protective layer may be used with LED array 120 and the optical bonding composition, but the optical bonding composition does not form a layer.

Figure 16:
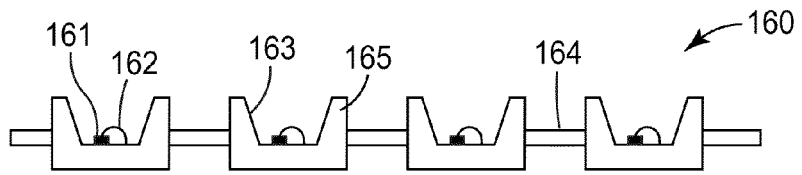
FIG. 16 is a schematic diagram in cross-sectional perspective of an exemplary LED array.

Some LED arrays comprise reflecting cups mounted to a lead frame with at least one LED die with wire bonds disposed inside at least one cup. FIG. 16 is a schematic diagram in cross-sectional perspective of exemplary LED assembly 160 in which the LED die 161 with wire bonds 162 are disposed in reflecting cups 163 mounted to lead frame 164. Substrate 165 comprises the reflecting cups, particularly the top surfaces of the reflecting cups.

Figure 17A:
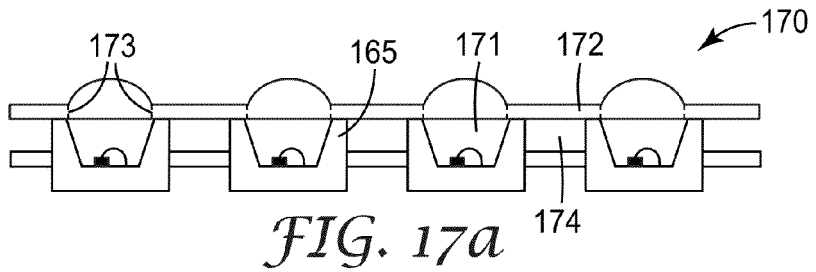
FIG. 17a is a schematic diagram in cross-sectional perspective of an exemplary LED assembly comprising an LED array and an optical layer comprising lens features.
Figure 17B:
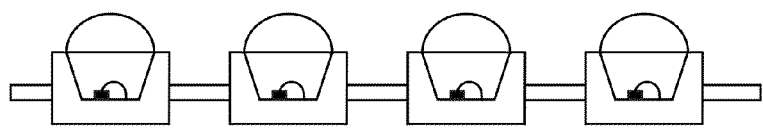
FIG. 17b is a schematic diagram in cross-sectional perspective of an exemplary array of LED devices having lenses.

For the embodiment shown in FIG. 16, the reflecting cups may be filled or slightly overfilled with the optical bonding composition. The optical layer may then be disposed on the substrate which may or may not have the optical bonding composition on it. FIG. 17a is a schematic diagram in cross-sectional perspective of LED assembly 170 in which the reflecting cups are not overfilled with optical bonding composition 171, and optical layer 172 is disposed on substrate 165. As described above, the optical bonding composition bonds to the optical layer. The optical layer can be perforated around the lens features, for example by kiss cutting, as shown by perforations 173. FIG. 17b is a schematic diagram in cross-sectional perspective of the LED devices after excess perforated optical layer is removed.

Figure 18A:
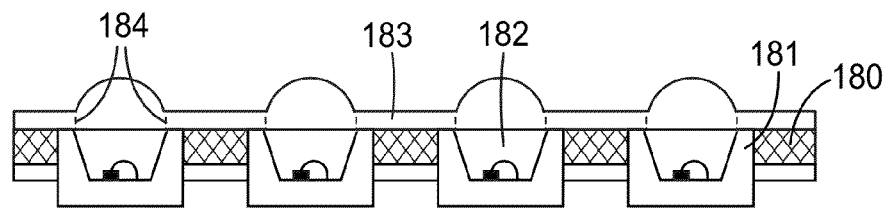
FIG. 18a is a schematic diagram in cross-sectional perspective of an exemplary LED assembly including an optical layer comprising lens features.
Figure 18B:
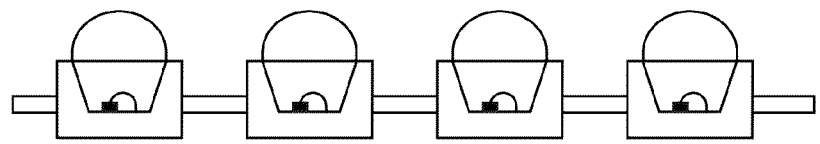
FIG. 18b is a schematic diagram in cross-sectional perspective of an exemplary array of LED devices having lenses.

For the embodiment shown in FIG. 17a, recesses 174 are formed between the optical layer, reflecting cups, and lead frame. Thus, the optical layer may need to be strong enough to cover the recesses between lens features without affecting optical coupling of the lens features with the LED die. If desired, the optical layer may be designed with protrusions that can fill in the recesses. Alternatively, a removable protective layer may be used to fill in the recesses. FIG. 18a is a schematic diagram in cross-sectional perspective of an embodiment in which a removable protective layer is used with the LED assembly of FIG. 16. In FIG. 18a, removable protective layer 180 fills the recesses such that the top surface of the removable protective layer is generally coplanar with substrate 181, i.e., the top surfaces of the reflecting cups. In this case, the removable protective layer is part of the substrate. Optical bonding composition 182 fills or slightly overfills the reflecting cups and an optical layer comprising a plurality of lens features is disposed thereon. As described above, the optical bonding composition bonds to the optical layer. The optical layer can be perforated around the lens features as shown by perforations 184. FIG. 18b is a schematic diagram in cross-sectional perspective of the LED devices after the removable protective layer and perforated optical layer 183 are removed. For the LED assembly shown in FIG. 18a, the optical bonding composition may form a layer on the substrate.

Figure 19A:
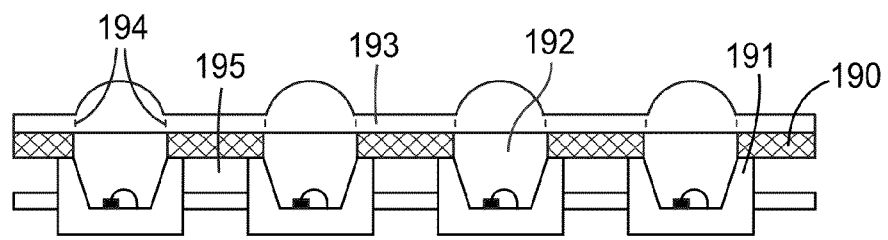
FIG. 19a is a schematic diagram in cross-sectional perspective of an exemplary LED assembly including an optical layer comprising lens features.
Figure 19B:
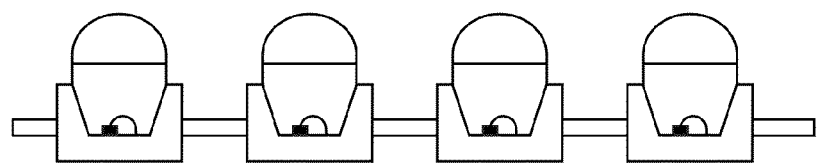
FIG. 19b is a schematic diagram in cross-sectional perspective of an exemplary array of LED devices having lenses.

FIG. 19a is a schematic diagram in cross-sectional perspective of another embodiment in which a removable protective layer is used with the LED assembly of FIG. 16. In FIG. 19a, removable protective layer 190 is disposed on substrate 191 such that the top surfaces of the reflecting cups are covered. In this case, the removable protective layer is the substrate. Optical bonding composition 192 fills or slightly overfills the reflecting cups and an optical layer comprising a plurality of lens features is disposed thereon. As described above, the optical bonding composition bonds to the optical layer. The optical layer can be perforated around the lens features as shown by perforations 194. FIG. 19b is a schematic diagram in cross-sectional perspective of the LED devices after the removable protective layer and perforated optical layer 193 are removed.

For the embodiment shown in FIG. 19a, recesses 195 are formed between the removable protective layer, reflecting cups, and lead frame. Thus, the removable protective layer may need to be strong enough to cover the recesses between lens features without affecting optical coupling of the lens features with the LED die. If desired, the removable protective layer may be designed with protrusions that can fill in the recesses. Alternatively, a filler layer may be used to fill in the recesses. The filler layer may comprise rubber or any of the materials that can be used as the removable protective layer.

Figure 20A:
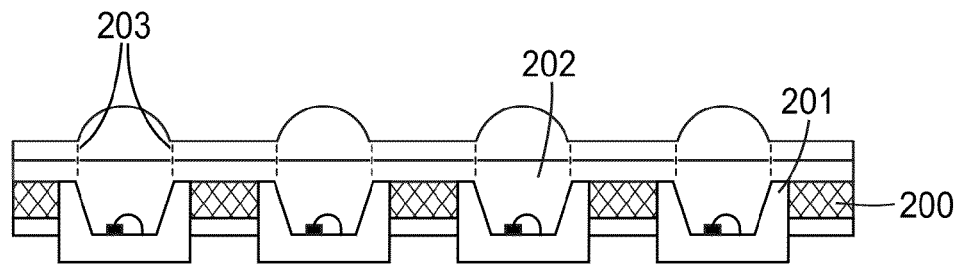
FIGS. 20a, 20b, and 21 are schematic diagrams in cross-sectional perspective of exemplary LED assemblies, each assembly including an optical layer comprising lens features.
Figure 20B:
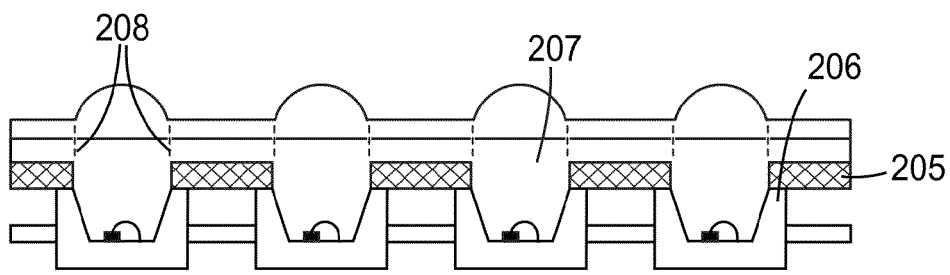

For the embodiments shown in FIGS. 18a and 19a, the optical bonding composition may form a layer on the substrate. FIGS. 20a and 20b are schematic diagrams in cross-sectional perspective of additional embodiments in which the optical bonding composition forms a layer in the LED assemblies of FIGS. 18a and 19a, respectively. In FIG. 20a, removable protective layer 200 is disposed such that the top surfaces of the reflecting cups and removable protective layer are generally coplanar. Optical bonding composition 202 overfills the reflecting cups such that a layer is formed. An optical layer comprising a plurality of lens features is disposed thereon. As described above, the optical bonding composition bonds to the optical layer. The optical layer can be perforated around the lens features as shown by perforations 203. In FIG. 20b, removable protective layer 205 is disposed on substrate 206 such that the top surfaces of the reflecting cups are covered. Optical bonding composition 207 overfills the reflecting cups such that a layer is formed. An optical layer comprising a plurality of lens features is disposed thereon. As described above, the optical bonding composition bonds to the optical layer. The optical layer can be perforated around the lens features as shown by perforations 208.

Figure 21:
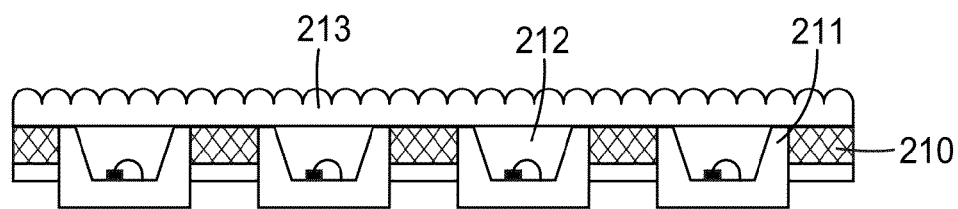

FIG. 21 is a schematic diagram in cross-sectional perspective of an additional embodiment in which the optical layer comprising a plurality of lens features is translationally invariant with respect to the position of the LED die. In FIG. 21, removable protective layer 210 fills the recesses such that the top surface of the removable protective layer is generally coplanar with substrate 211, i.e., the top surfaces of the reflecting cups. In this case, the removable protective layer is part of the substrate. Optical bonding composition 212 fills the reflecting cups. Optical layer 213 comprises a plurality of lens features such that the layer can be positioned anywhere or nearly anywhere relative to the positions of the LED die such that at least one LED die is optically coupled to the lens features over it. Generally, for an optical layer to be translationally invariant, the lens features must be on the microstructure or macrostructure scales as described above. Generally, for a translationally invariant optical layer, the lens features must be smaller than the smaller dimension of the width of the LED die.

Illustrative embodiments of this disclosure are discussed and reference has been made to possible variations and modifications in the disclosure will be apparent to those skilled in the art without departing from the scope of this disclosure, and it should be understood that this disclosure is not limited to the illustrative embodiments set forth herein. Accordingly, the disclosure is to be limited only be the claims provided below.

What is claimed is:

1. An LED assembly, comprising:
   a substrate comprising a plurality of reflecting cups;
   at least one LED die disposed in at least one reflecting cup;
   an optical bonding composition disposed over the at least one LED die and the substrate, forming a layer; and
   an optical layer comprising a plurality of lens features, wherein the plurality of lens features are configured to present multiple lens features over each of the plurality of reflecting cups, the optical layer contacting the optical bonding composition such that the at least one LED die is optically coupled to at least one of the multiple lens features over the reflecting cup containing the LED die.

2. The LED assembly of claim 1, wherein the optical bonding composition comprises a silicon-containing resin.

3. The LED assembly of claim 2, wherein the silicon-containing resin comprises a polyorganosiloxane.

4. The LED assembly of claim 1, wherein the optical bonding composition comprises a pressure sensitive adhesive.

5. The LED assembly of claim 1, wherein the optical bonding composition is an encapsulant.

6. The LED assembly of claim 1, further comprising an encapsulant disposed between the LED die and the optical bonding composition.

7. The LED assembly of claim 1, wherein the optical layer comprises a silicon-containing resin.

8. The LED assembly of claim 7, wherein the silicon-containing resin comprises a polyorganosiloxane.

9. The LED assembly of claim 1, wherein the lens features provide nonLambertian light distribution.

10. The LED assembly of claim 1, wherein the lens features comprise hemispherical lenses.

11. The LED assembly of claim 1, wherein the lens features comprise Fresnel lenses.

12. The LED assembly of claim 1, wherein the lens features have a side emitting lens shape.

13. An LED assembly, comprising:
   a substrate comprising a plurality of reflecting cups;
   at least one LED die disposed in at least one reflecting cup, wherein the LED die is defined by a first dimension and a second dimension that is smaller than the first dimension;
   an optical bonding composition disposed over the at least one LED die and the substrate, forming a layer; and
   an optical layer comprising a plurality of lens features wherein each of the plurality of lens features is smaller than the second dimension of the LED die, the optical layer contacting the optical bonding composition such that the at least one LED die is optically coupled to at least one lens feature.

* * * * *